(12) United States Patent
Koya et al.

(10) Patent No.: US 12,308,809 B2
(45) Date of Patent: May 20, 2025

(54) POWER AMPLIFICATION CIRCUIT

(71) Applicant: Murata Manufacturing Co., Ltd., Kyoto (JP)

(72) Inventors: Shigeki Koya, Kyoto (JP); Takayuki Tsutsui, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 730 days.

(21) Appl. No.: 17/460,543

(22) Filed: Aug. 30, 2021

(65) Prior Publication Data

US 2022/0103143 A1  Mar. 31, 2022

(30) Foreign Application Priority Data

Sep. 28, 2020  (JP) .................. 2020-161705

(51) Int. Cl.
| | | |
|---|---|---|
| *H03F 3/68* | (2006.01) | |
| *H03F 1/56* | (2006.01) | |
| *H03F 3/195* | (2006.01) | |
| *H03F 3/24* | (2006.01) | |
| *H03F 3/72* | (2006.01) | |

(52) U.S. Cl.
CPC ............... *H03F 3/72* (2013.01); *H03F 1/565* (2013.01); *H03F 3/195* (2013.01); *H03F 3/245* (2013.01); *H03F 2200/168* (2013.01); *H03F 2200/318* (2013.01); *H03F 2200/451* (2013.01); *H03F 2203/7215* (2013.01)

(58) Field of Classification Search
CPC . H03F 3/72; H03F 1/565; H03F 3/195; H03F 3/245; H03F 2200/168; H03F 2200/318; H03F 2200/451; H03F 2203/7215; H03F 2200/111; H03F 2203/7209; H03F 3/68; H03F 2200/372; H03F 3/602; H03F 1/0288; H03F 3/211
USPC .......................................................... 330/126
See application file for complete search history.

(56) References Cited

U.S. PATENT DOCUMENTS

| | | | | |
|---|---|---|---|---|
| 7,482,868 | B2 * | 1/2009 | Hageman | H03F 3/211 |
| | | | | 330/133 |
| 9,397,710 | B2 * | 7/2016 | Tsutsui | H03F 1/56 |
| 10,181,829 | B2 * | 1/2019 | Oshita | H03F 3/005 |
| 10,965,260 | B1 * | 3/2021 | Hahn | H03B 5/1215 |
| 11,152,893 | B2 * | 10/2021 | Yamada | H03G 3/3042 |
| 2009/0212861 | A1 * | 8/2009 | Lim | H03F 3/193 |
| | | | | 330/253 |
| 2018/0212578 | A1 * | 7/2018 | Oyama | H03G 1/0094 |
| 2021/0203288 | A1 * | 7/2021 | Sukemori | H03F 1/56 |

FOREIGN PATENT DOCUMENTS

JP  2010-041634 A  2/2010

* cited by examiner

*Primary Examiner* — Khanh V Nguyen
(74) *Attorney, Agent, or Firm* — McDonald Hopkins LLC

(57) ABSTRACT

A power amplification circuit includes first wiring supplied with a first signal having a first frequency, second wiring supplied with a second signal having a second frequency that differs from the first frequency, a first amplification circuit that amplifies the first signal supplied through the first wiring and supplies a first amplified signal to the second wiring, and a second amplification circuit that amplifies the signal supplied through the second wiring and outputs a second amplified signal.

14 Claims, 10 Drawing Sheets

POWER AMPLIFICATION CIRCUIT

CROSS REFERENCE TO RELATED APPLICATION

This application claims priority from Japanese Patent Application No. 2020-161705 filed on Sep. 28, 2020. The content of this application is incorporated herein by reference in its entirety.

BACKGROUND

The present disclosure relates to a power amplification circuit.

In mobile communication devices, such as mobile phones, power amplification circuits are used to amplify the power of radio frequency (RF) signals to be transmitted to base stations. In some of the power amplification circuits described above, the structure of an amplifier that amplifies RF signals can be switched (for example, Japanese Unexamined Patent Application Publication No. 2010-41634).

BRIEF SUMMARY

In the high frequency amplifier described in Japanese Unexamined Patent Application Publication No. 2010-41634, a common signal path is configured from the input terminal to the drive stage amplifier through the input matching circuit. This common signal path is connected to a high frequency power amplifier for a high frequency band through a large size field effect transistor (FET) and is connected to a high frequency power amplifier for a low frequency band through a small size FET. These FETs operate complementarily to connect any one of the two high frequency power amplifiers connected in parallel to each other to the common signal path. However, since the FET connected to the high frequency power amplifier for a high frequency band has a large size and a large parasitic capacitance, the amplification rate of a high frequency RF signal is reduced.

The present disclosure provides a power amplification circuit capable of suppressing reduction in the amplification rate due to the frequency in the structure to which two signals having different frequencies are input.

A power amplification circuit according to embodiments of the present disclosure includes first wiring configured to be supplied with a first signal having a first frequency, second wiring configured to be supplied with a second signal having a second frequency that differs from the first frequency, a first amplification circuit configured to amplify the first signal supplied through the first wiring and supply a first amplified signal to the second wiring, and a second amplification circuit configured to amplify the signal supplied through the second wiring and output a second amplified signal.

According to embodiments of the present disclosure, it is possible to provide a power amplification circuit that suppresses reduction in the amplification rate due to frequency in the structure to which two signals having different frequencies are input.

Other features, elements, characteristics and advantages of the present disclosure will become more apparent from the following detailed description of embodiments of the present disclosure with reference to the attached drawings.

DETAILED DESCRIPTION

Figure 1:
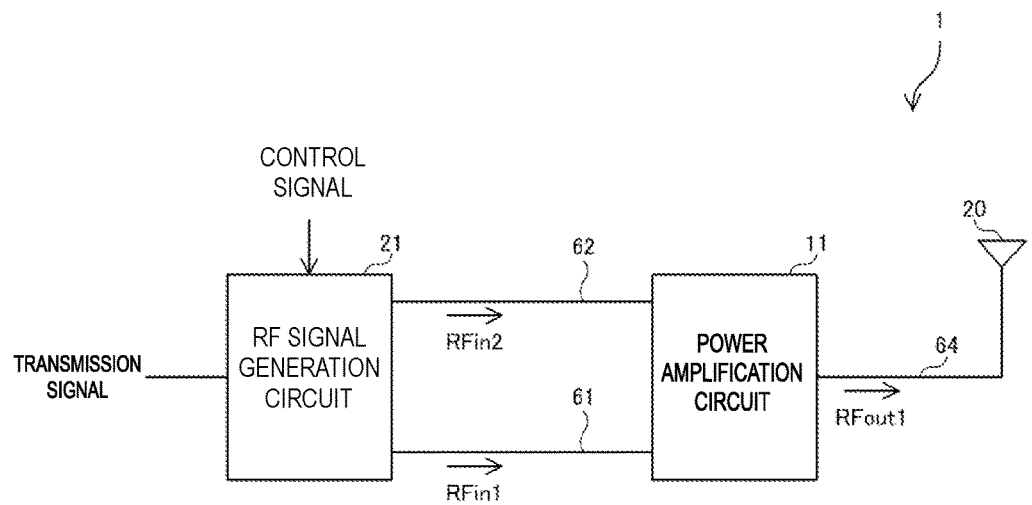
FIG. 1 is a diagram illustrating the structure of a transmission device according to a first embodiment of the present disclosure.

Embodiments of the present disclosure will be described below in detail with reference to the drawings. It should be noted that the same elements are denoted by the same reference characters to omit duplicate descriptions as much as possible.

First Embodiment

A transmission device according to a first embodiment will be described. FIG. 1 is a diagram illustrating the structure of the transmission device according to the first embodiment of the present disclosure. A transmission device 1 includes a power amplification circuit 11, an antenna 20, an RF signal generation circuit 21, and transmission lines 61, 62, and 64. The transmission device 1 is used by, for example, a mobile communication device to transmit various signals, such as voice, video, and data to a base station. It should be noted that a mobile communication device also includes a reception device for receiving signals from a base station, but the reception device will not be described.

The RF signal generation circuit 21 of the transmission device 1 generates a first signal having a first frequency, a second signal having a second frequency that differs from the first frequency, and a third signal having a third frequency that differs from the first frequency. Here, the first frequency is higher than the second frequency and the third frequency.

Figure 2:
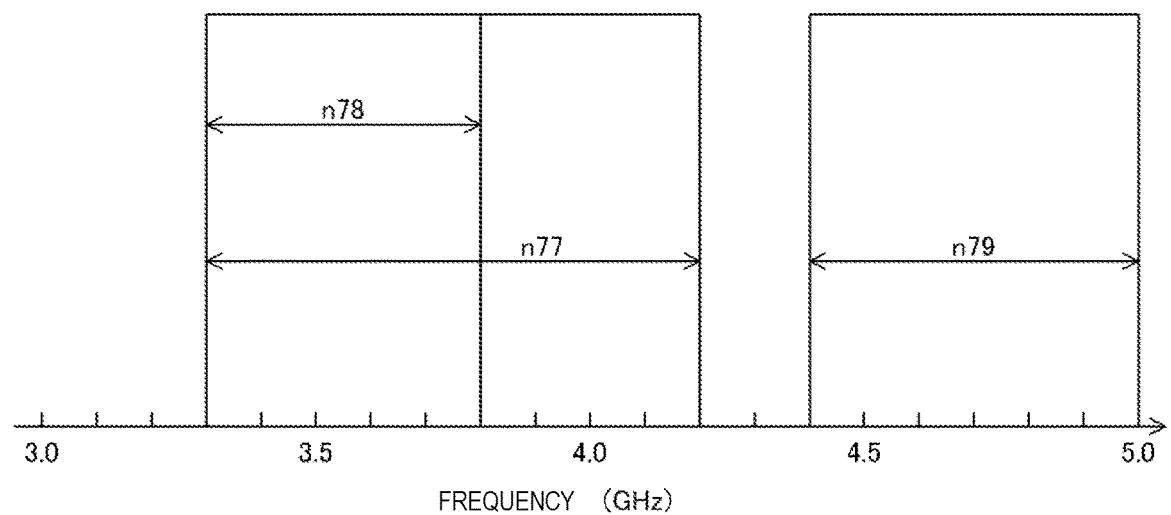
FIG. 2 is a diagram schematically illustrating an example of the frequency bands of RF signals transmitted by the transmission device according to the first embodiment of the present disclosure.

FIG. 2 is a diagram schematically illustrating an example of the frequency bands of RF signals transmitted by the transmission device according to the first embodiment of the present disclosure. It should be noted that the horizontal axis of FIG. 2 represents the frequency in "GHz". As illustrated in FIGS. 1 and 2, the RF signal generation circuit 21 generates the first signal, the second signal, and the third signal in the RF band in accordance with, for example, the communication standard of the fifth generation mobile communication system (5G).

In this embodiment, the first signal is an RF signal (which may be referred to below as the n79 signal) having a frequency (first frequency) in a predetermined band (channel) included in the n79 band (first frequency band) of, for example, not less than approximately 4.4 GHz and not more than approximately 5.0 GHz. The second signal is an RF signal (which may be referred to below as the n78 signal) having a frequency (second frequency) in a predetermined band (channel) included in the n78 band (second frequency band) of, for example, not less than approximately 3.3 GHz and not more than approximately 3.8 GHz. The third signal is an RF signal (which may be referred to below as the n77 signal) having a frequency (third frequency) in a predetermined band (channel) included in the n77 band (third frequency band) of, for example, not less than approximately 3.3 GHz and not more than approximately 4.2 GHz.

It should be noted that the n78 band and the n77 band overlap with each other in the band of not less than approximately 3.3 GHz and not more than approximately 3.8 GHz. In this embodiment, the n78 signal and the n77 signal are set by, for example, the country in which the mobile communication device is used and the communication line provider with which the mobile communication device communicates.

Specifically, in the control unit (not illustrated) of the mobile communication device, the channels to be used by the mobile communication device are set based on, for example, the country in which the mobile communication device is used, the communication line provider with which the mobile communication device communicates, and the like. The control unit generates a control signal including the channel specification based on the setting and outputs the generated control signal to the RF signal generation circuit 21.

The RF signal generation circuit 21 modulates a transmission signal including voice, video, data, and the like based on a control signal received from the control unit of a mobile communication device and generates input signals RFin1 and RFin2 for wireless transmission. Here, the input signal RFin1 is the n79 signal. The input signal RFin2 is at least one of the n77 signal and the n78 signal.

The RF signal generation circuit 21 performs the following processing when, for example, the mobile communication device communicates using technologies, such as carrier aggregation (CA) and dual connectivity (DC). That is, the RF signal generation circuit 21 generates the input signals RFin1 and RFin2 at the same time based on the control signal. The operation performed by the RF signal generation circuit 21 to generate the input signals RFin1 and RFin2 at the same time is referred to below as a simultaneous generation operation. In the simultaneous generation operation, the RF signal generation circuit 21 supplies the generated input signals RFin1 and RFin2 at the same time to the transmission lines 61 and 62, respectively.

In addition, the RF signal generation circuit 21 performs the following processing when, for example, the mobile communication device communicates using any one of the input signals RFin1 and RFin2. That is, the RF signal generation circuit 21 generates any one of the input signals RFin1 and RFin2 based on the control signal. The operation performed by the RF signal generation circuit 21 to generate only the input signal RFin1 is referred to below as the first generation operation. In addition, the operation performed by the RF signal generation circuit 21 to generate only the input signal RFin2 is referred to as the second generation operation.

The RF signal generation circuit 21 supplies the input signal RFin1 to the transmission line 61 in the first generation operation. The RF signal generation circuit 21 supplies the input signal RFin2 to the transmission line 62 in the second generation operation.

The power amplification circuit 11 receives the input signals RFin1 and RFin2 output from the RF signal generation circuit 21 through the transmission lines 61 and 62, respectively, and amplifies the levels thereof to those required to transmit the input signals RFin1 and RFin2 to the base station. The power amplification circuit 11 outputs an amplified output signal RFout1 (second amplified signal) to the antenna 20 through the transmission line 64. The output signal RFout1 is transmitted to the base station through the antenna 20.

Figure 3:
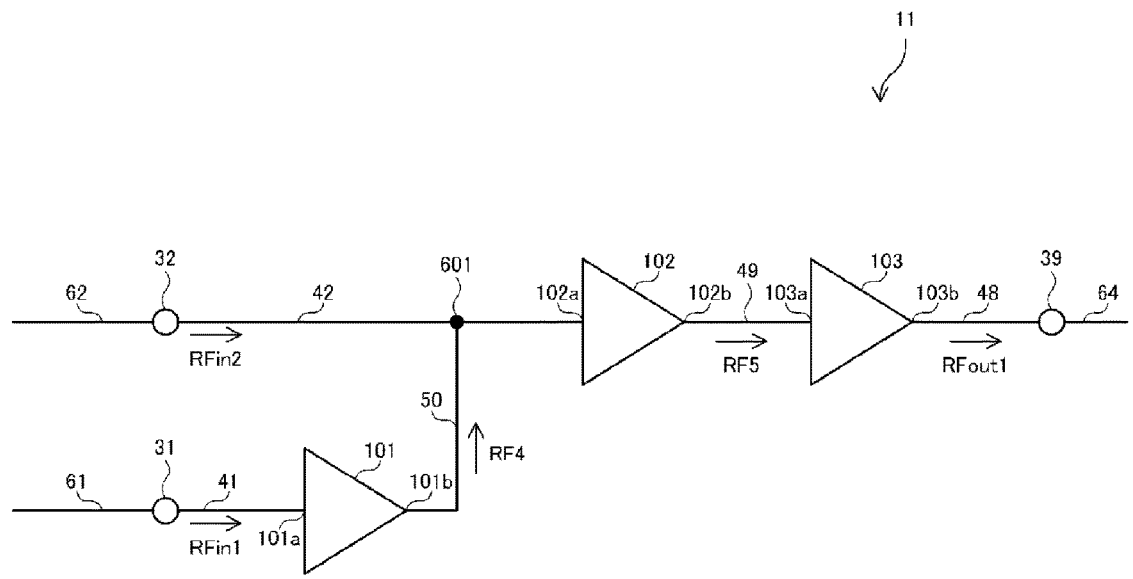
FIG. 3 is a circuit diagram of a power amplification circuit according to the first embodiment of the present disclosure.

The power amplification circuit according to the first embodiment will be described. FIG. 3 is a circuit diagram of the power amplification circuit according to the first embodiment of the present disclosure. The power amplification circuit 11 according to the first embodiment includes a first amplification circuit, a second amplification circuit, and transmission lines 41 (first wiring), 42 (second wiring), 48, 49, and 50. The first amplification circuit includes an amplifier 101. The second amplification circuit includes an amplifier 102 and an amplifier 103 connected in series.

Each of the amplifiers 101, 102, and 103 includes a bipolar transistor, such as, for example, a heterojunction bipolar transistor (HBT). It should be noted that each of the amplifiers 101, 102, and 103 may include a FET.

An RF signal input terminal 31 is connected to the transmission line 61 and the transmission line 41 and supplied with the input signal RFin1. An RF signal input terminal 32 is connected to the transmission line 62 and the transmission line 42 and supplied with the input signal RFin2. A node 601 is provided in the transmission line 42. An RF signal output terminal 39 is connected to the transmission line 64 and the transmission line 48.

The amplifier 101 has an input terminal 101a connected to the RF signal input terminal 31 through the transmission line 41 and an output terminal 101b connected to the node

601 through the transmission line 50. The amplifier 101 amplifies the input signal RFin1 supplied to the input terminal 101*a* through the transmission line 41 and supplies the amplified signal RF4 (first amplified signal) to the transmission line 42 through the output terminal 101*b* and the transmission line 50.

The amplifier 102 has an input terminal 102*a* connected to the RF signal input terminal 32 through the transmission line 42 and an output terminal 102*b*. The amplifier 102 amplifies the signal supplied to the input terminal 102*a* through the transmission line 42, specifically at least one of the input signal RFin2 and the amplified signal RF4, and generates an amplified signal RF5.

More specifically, in the simultaneous generation operation, the amplifier 102 amplifies the input signal RFin2 and the amplified signal RF4 at the same time and generates the amplified signal RF5. Alternatively, the amplifier 102 amplifies only the amplified signal RF4 and generates the amplified signal RF5 in the first generation operation. Alternatively, the amplifier 102 amplifies only the input signal RFin2 and generates the amplified signal RF5 in the second generation operation. The amplifier 102 outputs the amplified signal RF5 through the output terminal 102*b*.

The amplifier 103 has an input terminal 103*a* connected to the output terminal 102*b* of the amplifier 102 through the transmission line 49 and an output terminal 103*b* connected to the RF signal output terminal 39 through the transmission line 48. The amplifier 103 amplifies the amplified signal RF5 input through the input terminal 103*a* and generates the output signal RFout1. The amplifier 103 outputs the generated output signal RFout1 to the RF signal output terminal 39 through the transmission line 48.

Second Embodiment

A transmission device according to a second embodiment will be described. In the second and subsequent embodiments, the matters identical to the first embodiment will not be described and only the differences will be described. In particular, the same operations and advantageous effects obtained from the same structure will not be described for each embodiment.

Figure 4:
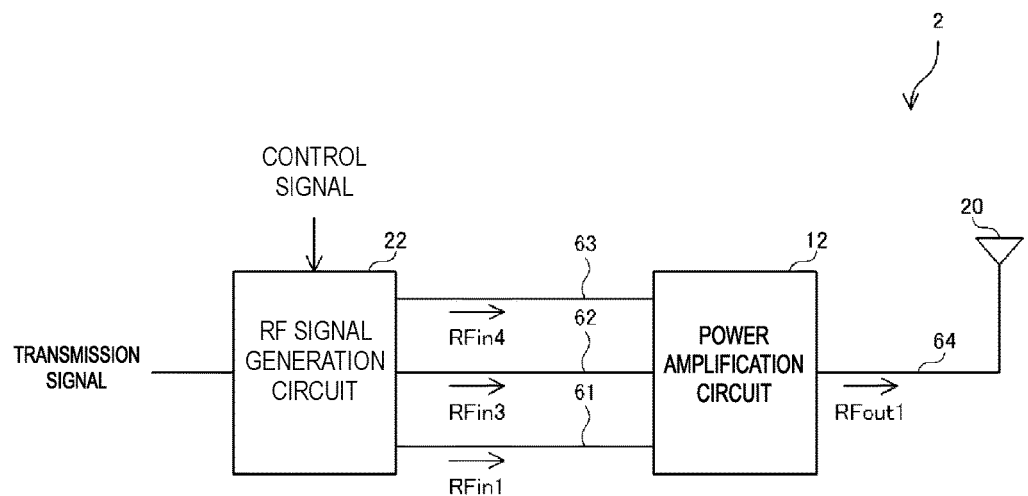
FIG. 4 is a diagram illustrating the structure of a transmission device according to a second embodiment of the present disclosure.

FIG. 4 is a diagram illustrating the structure of the transmission device according to the second embodiment of the present disclosure. A transmission device 2 according to the second embodiment is different from the transmission device 1 according to the first embodiment in that the transmission device 2 includes a power amplification circuit 12 and an RF signal generation circuit 22 instead of the power amplification circuit 11 and the RF signal generation circuit 21 and further includes a transmission line 63 in addition to the transmission lines 61 and 62, as illustrated in FIG. 4.

The RF signal generation circuit 22 modulates the transmission signal based on, for example, a control signal received from the control unit of a mobile communication device and generates input signals RFin1, RFin3, and RFin4 for wireless transmission. Here, the input signals RFin3 and RFin4 are the n78 signal and the n77 signal, respectively.

The RF signal generation circuit 22 performs the following processing when, for example, the mobile communication device communicates using technologies, such as CA and DC. That is, the RF signal generation circuit 22 performs the simultaneous generation operation that generates the input signals RFin1, RFin3, and RFin4 at the same time based on the control signal. It should be noted that the RF signal generation circuit 22 may generate two of the input signals RFin1, RFin3, and RFin4 at the same time in the simultaneous generation operation. In the simultaneous generation operation, the RF signal generation circuit 22 supplies the generated input signals RFin1, RFin3, and RFin4 at the same time to the transmission lines 61, 62, and 63, respectively.

In addition, the RF signal generation circuit 22 performs the following processing when, for example, the mobile communication device communicates using any one of the input signals RFin1, RFin3, and RFin4. That is, the RF signal generation circuit 22 generates any one of the input signals RFin1, RFin3, and RFin4 based on the control signal. The operation performed by the RF signal generation circuit 22 to generate only the input signal RFin3 is referred to below as the third generation operation. In addition, the operation performed by the RF signal generation circuit 22 to generate only the input signal RFin4 is referred to as the fourth generation operation.

The RF signal generation circuit 22 supplies the input signal RFin3 to the transmission line 62 in the third generation operation. The RF signal generation circuit 22 supplies the input signal RFin4 to the transmission line 63 in the fourth generation operation.

Figure 5:
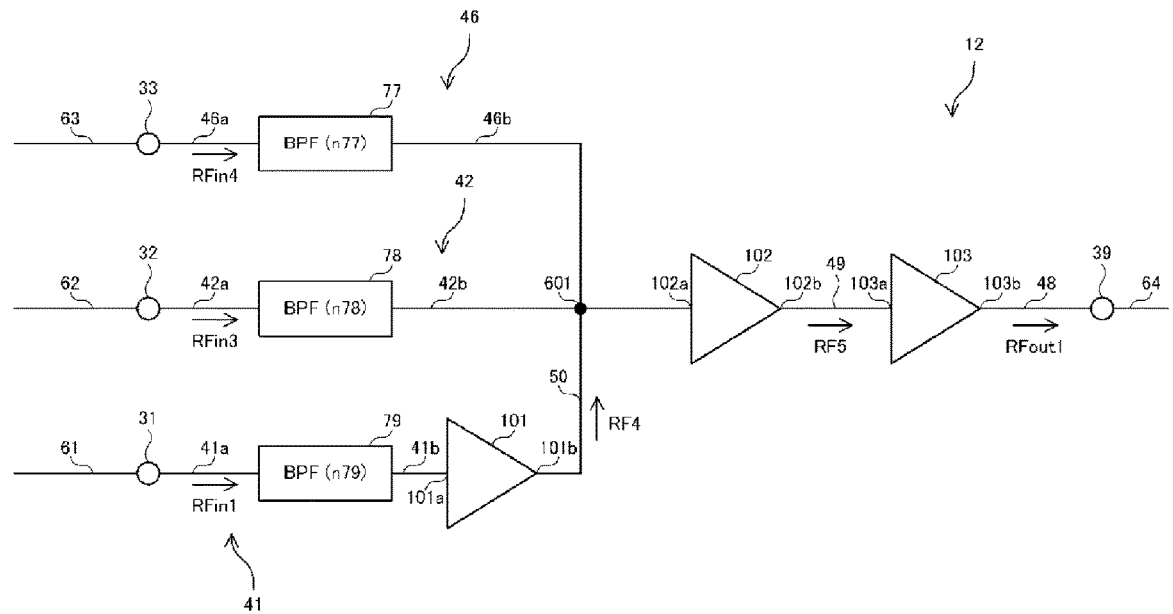
FIG. 5 is a circuit diagram of a power amplification circuit according to the second embodiment of the present disclosure.

The power amplification circuit according to the second embodiment will be described. FIG. 5 is a circuit diagram of the power amplification circuit according to the second embodiment of the present disclosure. As compared with the power amplification circuit 11 illustrated in FIG. 3, the power amplification circuit 12 according to the second embodiment further includes an RF signal input terminal 33, a transmission line 46, and band pass filters 77, 78 (second filter), and 79 (third filter). The transmission line 41 includes transmission lines 41*a* and 41*b*. The transmission line 42 includes transmission lines 42*a* and 42*b*. The transmission line 46 includes transmission lines 46*a* and 46*b*.

The RF signal input terminal 31 is connected to the transmission line 61 and the transmission line 41 and supplied with the input signal RFin1. The RF signal input terminal 32 is connected to the transmission line 62 and the transmission line 42 and supplied with the input signal RFin3. The RF signal input terminal 33 is connected to the transmission line 63 and the transmission line 46 and supplied with the input signal RFin4.

The band pass filter 79 is provided in the transmission line 41 that connects the RF signal input terminal 31 and the amplifier 101 to each other. Specifically, the band pass filter 79 has a first end connected to the RF signal input terminal 31 through the transmission line 41*a* and a second end connected to the input terminal 101*a* of the amplifier 101 through the transmission line 41*b*. When the input signal RFin1 is supplied through the transmission line 41*a*, the band pass filter 79 attenuates the frequency component (that is, noise) that deviates from the n79 band and passes the input signal RFin1 to the amplifier 101.

The band pass filter 78 is provided between the RF signal input terminal 32 and the node 601 in the transmission line 42 that connects the RF signal input terminal 32 and the amplifier 102 to each other. Specifically, the band pass filter 78 has a first end connected to the RF signal input terminal 32 through the transmission line 42*a* and a second end connected to the input terminal 102*a* of the amplifier 102 through the transmission line 42*b*. When the input signal RFin3 is supplied through the transmission line 42*a*, the band pass filter 78 attenuates the frequency component (that is, noise) that deviates from the n78 band and passes the input signal RFin3 to the amplifier 102.

The band pass filter 77 is provided in the transmission line 46 that connects the RF signal input terminal 33 and the node 601 provided in the transmission line 46b to each other. Specifically, the band pass filter 77 has a first end connected to the RF signal input terminal 33 through the transmission line 46a and a second end connected to the node 601 through the transmission line 46b. When the input signal RFin4 is supplied through the transmission line 46a, the band pass filter 77 attenuates the frequency component (that is, noise) that deviates from the n77 band and passes the input signal RFin4 to the node 601, that is, the amplifier 102.

In the simultaneous generation operation, the amplifier 102 amplifies the input signals RFin3 and RFin4 and the amplified signal RF4 at the same time and generates the amplified signal RF5. The amplifier 102 amplifies only the input signal RFin3 and generates the amplified signal RF5 in the third generation operation. The amplifier 102 amplifies only the input signal RFin4 and generates the amplified signal RF5 in the fourth generation operation. The amplifier 102 outputs the amplified signal RF5 through the output terminal 102b.

It should be noted that the power amplification circuit 12 according to this embodiment includes the band pass filters 77, 78, and 79, but the power amplification circuit 12 may include any one or any two of the band pass filters 77, 78, and 79. The band pass filters 77, 78, and 79 pass at least the necessary signals, are not limited to complete band pass filters, and may be low pass filters or high pass filters. In addition, the power amplification circuit 12 does not need to include the band pass filters 77, 78, and 79.

Third Embodiment

Figure 6:
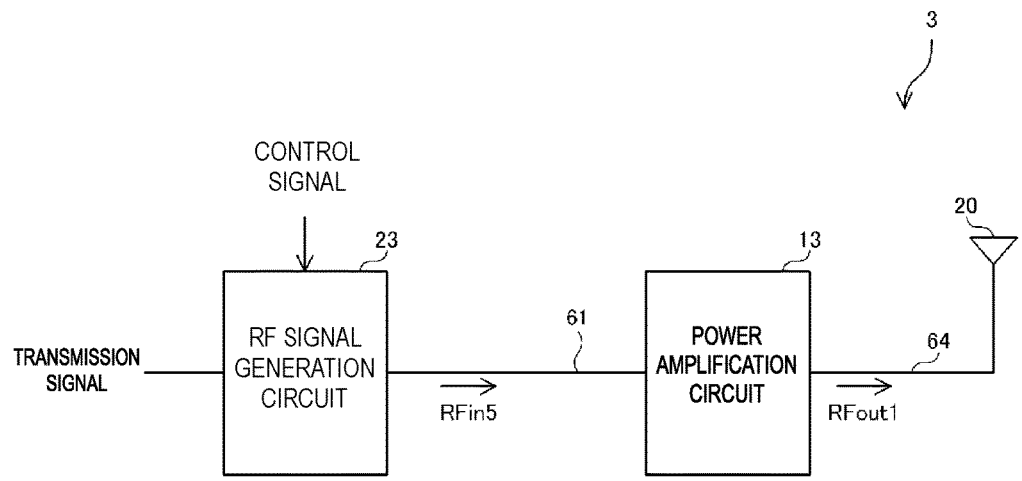
FIG. 6 is a diagram illustrating the structure of a transmission device according to a third embodiment of the present disclosure.

A transmission device according to a third embodiment will be described. FIG. 6 is a diagram illustrating the structure of the transmission device according to the third embodiment of the present disclosure. A transmission device 3 according to the third embodiment is different from the transmission device 1 according to the first embodiment in that the transmission device 3 includes a power amplification circuit 13 and an RF signal generation circuit 23 instead of the power amplification circuit 11 and the RF signal generation circuit 21 and does not include the transmission line 62, as illustrated in FIG. 6.

The RF signal generation circuit 23 modulates the transmission signal based on, for example, a control signal received from the control unit of a mobile communication device and generates an input signal RFin5 for wireless transmission. Here, the input signal RFin5 includes any one, any two, or all of the n77 signal, the n78 signal, and the n79 signal.

The RF signal generation circuit 23 performs the simultaneous generation operation that generates the n77 signal, the n78 signal, and the n79 signal at the same time as the input signal RFin5 based on the control signal when, for example, the mobile communication device communicates using technologies, such as CA and DC. It should be noted that the RF signal generation circuit 23 may generate two of the n77 signal, the n78 signal, and the n79 signal at the same time in the simultaneous generation operation.

In addition, the RF signal generation circuit 23 performs the following processing when, for example, the mobile communication device communicates using any one of the n77 signal, the n78 signal, and the n79 signal. That is, the RF signal generation circuit 23 generates any one of the n77 signal, the n78 signal, and the n79 signal based on the control signal. The RF signal generation circuit 23 supplies the generated input signal RFin5 to the transmission line 61.

Figure 7:
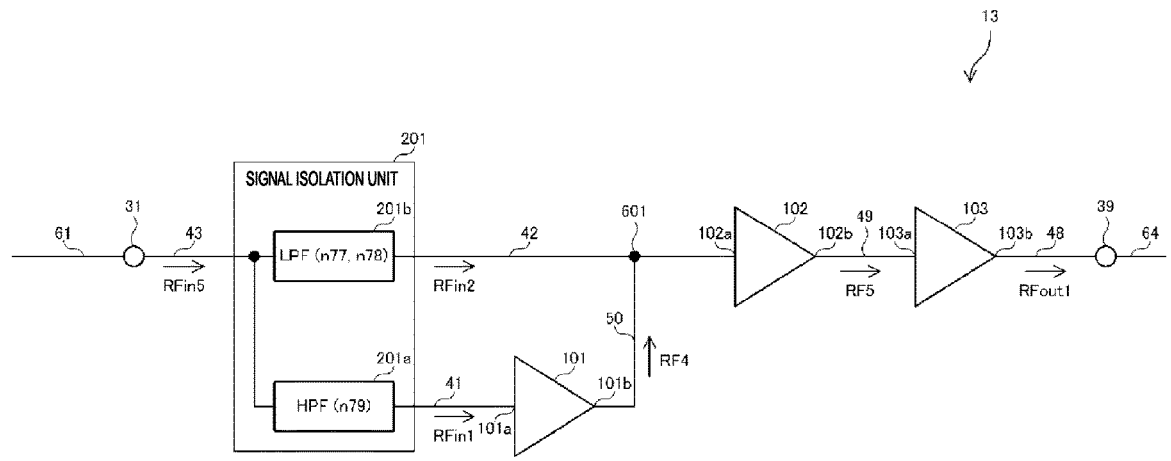
FIG. 7 is a circuit diagram of a power amplification circuit according to the third embodiment of the present disclosure.

The power amplification circuit according to the third embodiment will be described. FIG. 7 is a circuit diagram of the power amplification circuit according to the third embodiment of the present disclosure. As compared with the power amplification circuit 11 illustrated in FIG. 3, the power amplification circuit 13 according to the third embodiment further includes a transmission line 43 (third wiring) and a signal isolation unit 201. The signal isolation unit 201 includes a high pass filter (HPF) 201a and a low pass filter (LPF) 201b.

The RF signal input terminal 31 is connected to the transmission line 61 and the transmission line 43 and supplied with the input signal RFin5. The signal isolation unit 201 supplies the input signal RFin1 (n79 signal) of the input signal RFin5 supplied through the transmission line 43 to the transmission line 41 and supplies the input signal RFin2 (at least one of the n77 signal and the n78 signal) of the input signal RFin5 to the transmission line 42.

Specifically, the signal isolation unit 201 is, for example, a diplexer (branching filter). Specifically, the high pass filter 201a of the signal isolation unit 201 has a first end connected to the RF signal input terminal 31 through the transmission line 43 and a second end connected to the input terminal 101a of the amplifier 101 through the transmission line 41.

The high pass filter 201a has a cutoff frequency in a frequency band (which may be referred to below as an inter-band frequency band) between, for example, the n77 band and the n79 band, attenuates the RF signal having a frequency lower than the cutoff frequency, and outputs the RF signal to the amplifier 101. Specifically, the inter-band frequency band is not less than approximately 4.2 GHz and not more than approximately 4.4 GHz. When the input signal RFin5 is supplied through the transmission line 43, the high pass filter 201a attenuates the n77 signal and the n78 signal and passes the n79 signal (that is, the input signal RFin1) to the amplifier 101.

The low pass filter 201b has a first end connected to the RF signal input terminal 31 through the transmission line 43 and a second end connected to the input terminal 102a of the amplifier 102 through the transmission line 42.

The low pass filter 201b has a cutoff frequency in, for example, the inter-band frequency band, attenuates the RF signal having a frequency higher than the cutoff frequency, and outputs the RF signal to the amplifier 102. That is, when the input signal RFin5 is supplied through the transmission line 43, the low pass filter 201b attenuates the n79 signal and passes the n77 signal and the n78 signal (that is, the input signal RFin2) to the amplifier 102.

It should be noted that the signal isolation unit 201 according to this embodiment is achieved by the high pass filter 201a and the low pass filter 201b, but the signal isolation unit 201 may be achieved by two band pass filters. Specifically, in the signal isolation unit 201, the band pass filter 79 may be provided instead of the high pass filter 201a and the band pass filter 77 may be provided instead of the low pass filter 201b.

Figure 8:
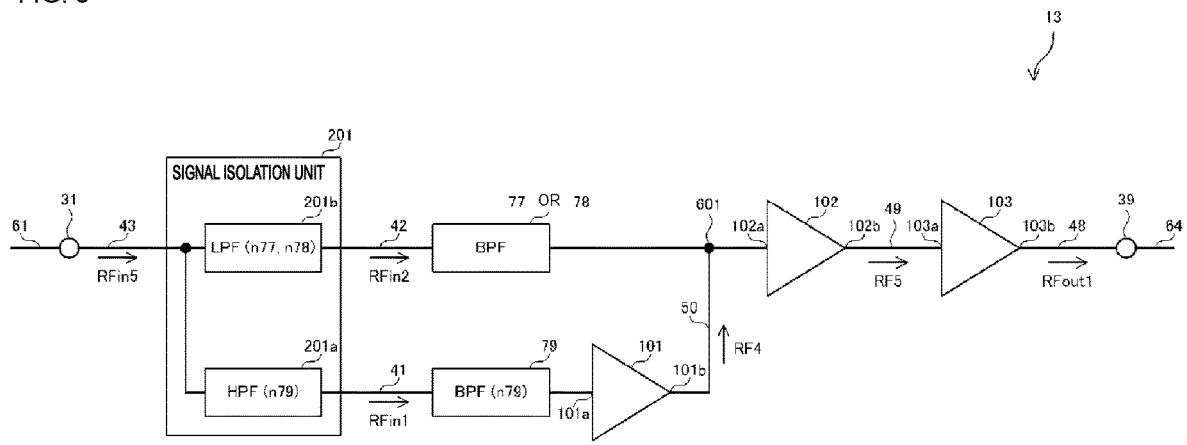
FIG. 8 is a circuit diagram of a power amplification circuit according to a modification of the third embodiment of the present disclosure.

FIG. 8 is a circuit diagram of a power amplification circuit according to a modification of the third embodiment of the present disclosure. In the power amplification circuit 13 according to this embodiment, the band pass filter 79 may be provided in the transmission line 41 and the band pass filter 77 or 78 may be provided between the signal isolation unit 201 and the node 601 in the transmission line 42, as illustrated in FIG. 8. It should be noted that the band pass filters 77 and 78 are not provided in the transmission line 42 of the power amplification circuit 13, but the band pass filter 79 may be provided in the transmission line 41. In addition, the band pass filter 79 is not provided in the transmission line 41 of the power amplification circuit 13, but the band pass filter 77 or 78 may be provided between the signal isolation unit 201 and the node 601 in the transmission line 42.

Fourth Embodiment

Figure 9:
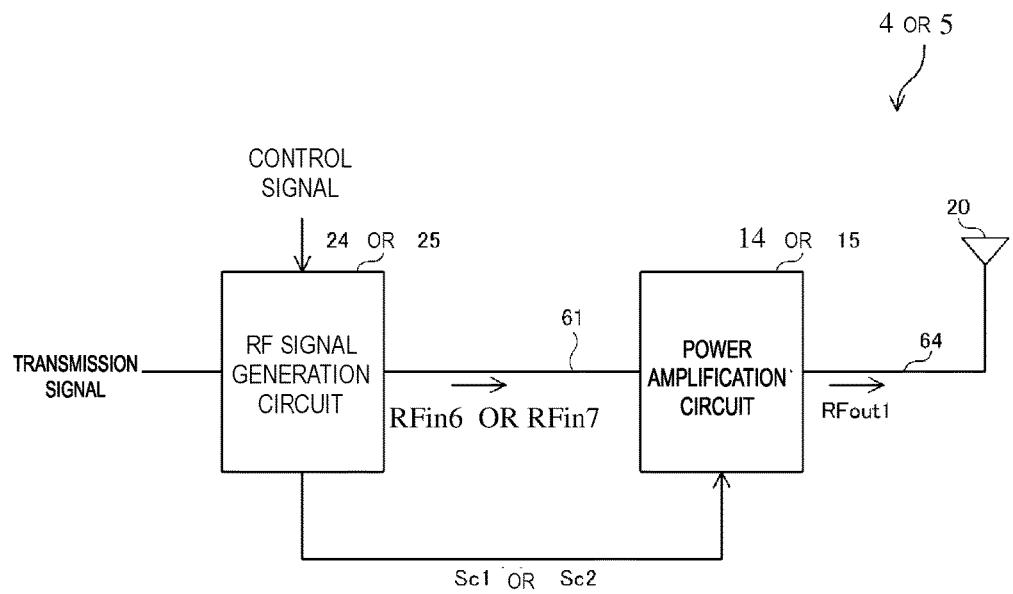
FIG. 9 is a diagram illustrating the structures of transmission devices according to fourth and fifth embodiments of the present disclosure.

A transmission device according to a fourth embodiment will be described. FIG. 9 is a diagram illustrating the structures of the transmission devices according to fourth and fifth embodiments of the present disclosure. A transmission device 4 according to the fourth embodiment is different from the transmission device 1 according to the first embodiment in that the transmission device 4 includes a power amplification circuit 14 and an RF signal generation circuit 24 instead of the power amplification circuit 11 and the RF signal generation circuit 21 and does not include the transmission line 62, as illustrated in FIG. 9.

The RF signal generation circuit 24 modulates the transmission signal based on, for example, a control signal received from the control unit of a mobile communication device and generates an input signal RFin6 for wireless transmission. Here, the input signal RFin6 is any one of the input signals RFin1 (n79 signal) and RFin2 (at least one of the n77 signal and the n78 signal). That is, the RF signal generation circuit 24 generates the input signals RFin1 and RFin2 separately from each other. In other words, the RF signal generation circuit 24 does not generate input signals RFin1 and RFin2 at the same time.

The RF signal generation circuit 24 performs the following processing when, for example, the mobile communication device communicates using the n79 signal. That is, the RF signal generation circuit 24 generates the input signal RFin6 based on the control signal, supplies the generated input signal RFin6 to the transmission line 61, and outputs a switch changeover signal Sc1 indicating the first level to the power amplification circuit 14. In this case, the input signal RFin6 is the input signal RFin1.

In addition, the RF signal generation circuit 24 performs the following processing when, for example, the mobile communication device communicates using at least one of the n77 signal and the n78 signal. That is, the RF signal generation circuit 24 generates the input signal RFin6 based on the control signal, supplies the generated input signal RFin6 to the transmission line 61, and outputs the switch changeover signal Sc1 indicating the second level to the power amplification circuit 14. In this case, the input signal RFin6 is the input signal RFin2.

Figure 10:
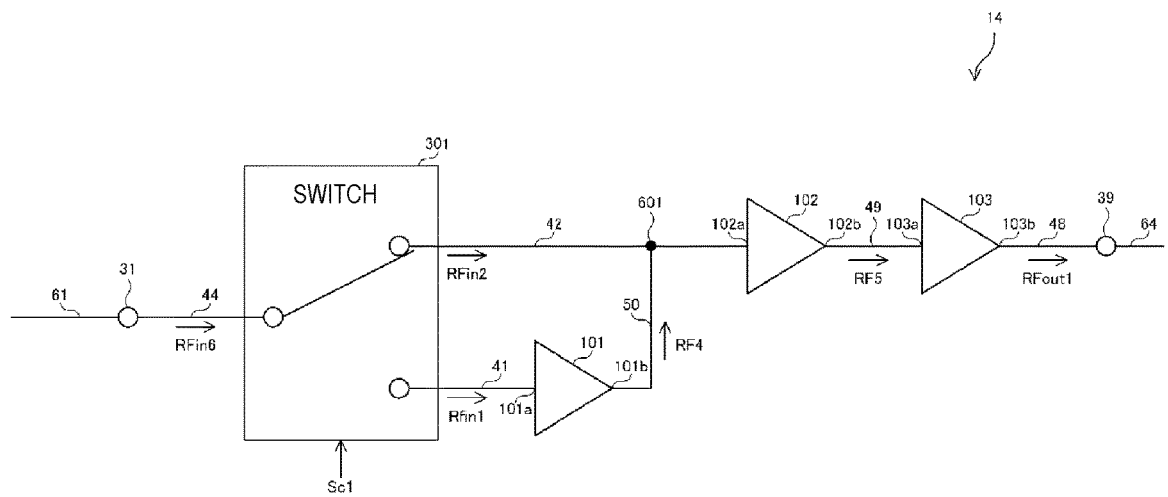
FIG. 10 is a circuit diagram of a power amplification circuit according to the fourth embodiment of the present disclosure.

The power amplification circuit according to the fourth embodiment will be described. FIG. 10 is a circuit diagram of the power amplification circuit according to the fourth embodiment of the present disclosure. As compared with the power amplification circuit 11 illustrated in FIG. 3, the power amplification circuit 14 according to the fourth embodiment further includes a transmission line 44 (fourth wiring) and a switch 301 (first switch unit).

The RF signal input terminal 31 is connected to the transmission line 61 and the transmission line 44 and supplied with the input signal RFin6. The switch 301 is configured to make the transmission line 44 connectable to any one of the transmission line 41 and the transmission line 42. Specifically, the switch 301 is a single-pole double-throw (SPDT) switch and is achieved by, for example, a FET.

The switch 301 has a first end connected to the RF signal input terminal 31 through the transmission line 44, a second end connected to the input terminal 101a of the amplifier 101 through the transmission line 41, and a third end connected to the input terminal 102a of the amplifier 102 through the transmission line 42.

After receiving the switch changeover signal Sc1 indicating the first level from the RF signal generation circuit 24, the switch 301 electrically connects the first end and the second end thereof to each other. Since the input signal RFin1 is supplied to the RF signal input terminal 31 through the transmission line 61 at this time, the input signal RFin1 is supplied to the amplifier 101 through the RF signal input terminal 31, the transmission line 44, the switch 301, and the transmission line 41.

In contrast, after receiving the switch changeover signal Sc1 indicating the second level from the RF signal generation circuit 24, the switch 301 electrically connects the first end and the third end thereof to each other. Since the input signal RFin2 is supplied to the RF signal input terminal 31 through the transmission line 61 at this time, the input signal RFin2 is supplied to the amplifier 102 through the RF signal input terminal 31, the transmission line 44, the switch 301, and the transmission line 42.

It should be noted that the switch 301 is in any one of the state in which the first end and the second end thereof are electrically connected to each other and the state in which the first end and the third end thereof are electrically connected to each other in the power amplification circuit 14 according to this embodiment, but the switch 301 may be in the state in which the first end thereof is electrically connected to none of the second end and the third end thereof. In this state, the transmission line 44 is electrically insulated from both of the transmission line 41 and the transmission line 42.

In addition, in the power amplification circuit 14 according to this embodiment, the band pass filter 79 may be provided in the transmission line 41. In addition, in the power amplification circuit 14, the band pass filter 77 may be provided between the switch 301 and the node 601 in the transmission line 42.

Fifth Embodiment

A transmission device according to a fifth embodiment will be described. A transmission device 5 according to the fifth embodiment is different from the transmission device 1 according to the first embodiment in that the transmission device 5 includes a power amplification circuit 15 and an RF signal generation circuit 25 instead of the power amplification circuit 11 and the RF signal generation circuit 21 and does not include the transmission line 62, as illustrated in FIG. 9.

The RF signal generation circuit 25 modulates the transmission signal based on, for example, a control signal received from the control unit of a mobile communication device and generates an input signal RFin7 for wireless transmission. Here, the input signal RFin7 is any one of the input signal RFin1 (n79 signal), the input signal RFin3 (n78 signal), and the input signal RFin4 (n77 signal). The RF signal generation circuit 25 generates the input signals RFin1, RFin3, and RFin4 separately from each other. In other words, the RF signal generation circuit 25 does not generate at least two of the input signals RFin1, RFin3, and RFin4 at the same time.

The RF signal generation circuit 25 performs the following processing when, for example, the mobile communication device communicates using the n79 signal. That is, the RF signal generation circuit 25 generates the input signal RFin7 based on the control signal, supplies the generated input signal RFin7 to the transmission line 61, and outputs a switch changeover signal Sc2 indicating the first level to the power amplification circuit 15. In this case, the input signal RFin7 is the input signal RFin1.

In addition, the RF signal generation circuit 25 performs the following processing when, for example, the mobile communication device communicates using the n78 signal. That is, the RF signal generation circuit 25 generates the input signal RFin7 based on the control signal, supplies the generated input signal RFin7 to the transmission line 61, and outputs the switch changeover signal Sc2 indicating the third level to the power amplification circuit 15. In this case, the input signal RFin7 is the input signal RFin3.

In addition, the RF signal generation circuit 25 performs the following processing when, for example, the mobile communication device communicates using the n77 signal. That is, the RF signal generation circuit 25 generates the input signal RFin7 based on the control signal, supplies the generated input signal RFin7 to the transmission line 61, and outputs the switch changeover signal Sc2 indicating the fourth level to the power amplification circuit 15. In this case, the input signal RFin7 is the input signal RFin4.

Figure 11:
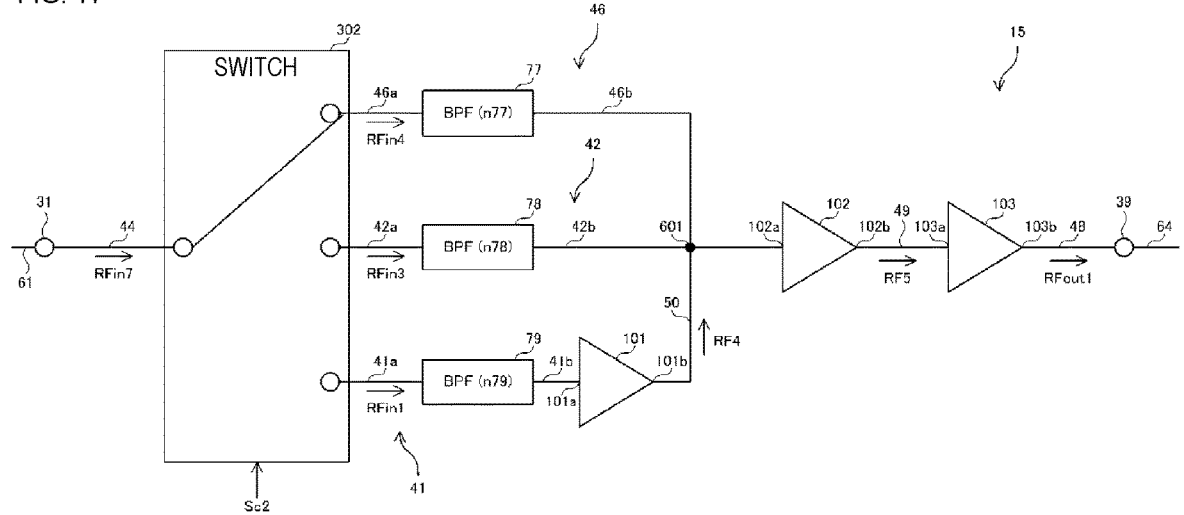
FIG. 11 is a circuit diagram of a power amplification circuit according to the fifth embodiment of the present disclosure.

The power amplification circuit according to the fifth embodiment will be described. FIG. 11 is a circuit diagram of the power amplification circuit according to the fifth embodiment of the present disclosure. As compared with the power amplification circuit 11 illustrated in FIG. 3, the power amplification circuit 15 according to the fifth embodiment further includes the transmission lines 44 (fourth wiring) and 46, a switch 302 (first switch unit), the band pass filters 77, 78 (second filter), and 79 (third filter). The transmission line 41 includes the transmission lines 41a and 41b. The transmission line 42 includes the transmission lines 42a and 42b. The transmission line 46 includes the transmission lines 46a and 46b.

The RF signal input terminal 31 is connected to the transmission line 61 and the transmission line 44 and supplied with the input signal RFin7. The switch 302 is configured to make the transmission line 44 connectable to any one of the transmission line 41, the transmission line 42, and the transmission line 46. Specifically, the switch 302 is a single-pole three-throw (SP3T) switch and is achieved by, for example, a FET.

The switch 302 has a first end connected to the RF signal input terminal 31 through the transmission line 44, a second end connected to the transmission line 41a, a third end connected to the transmission line 42a, and a fourth end connected to the transmission line 46a.

After receiving the switch changeover signal Sc2 indicating the first level from the RF signal generation circuit 25, the switch 302 electrically connects the first end and the second end thereof to each other. At this time, the input signal RFin1 is supplied to the transmission line 41a through the transmission line 61, the RF signal input terminal 31, the transmission line 44, and the switch 302.

After receiving the switch changeover signal Sc2 indicating the third level from the RF signal generation circuit 25, the switch 302 electrically connects the first end and the third end thereof to each other. At this time, the input signal RFin3 is supplied to the transmission line 42a through the transmission line 61, the RF signal input terminal 31, the transmission line 44, and the switch 302.

After receiving the switch changeover signal Sc2 indicating the fourth level from the RF signal generation circuit 25, the switch 302 electrically connects the first end and the fourth end thereof to each other. At this time, the input signal RFin4 is supplied to the transmission line 46a through the transmission line 61, the RF signal input terminal 31, the transmission line 44, and the switch 302.

The band pass filter 79 has a first end connected to the transmission line 41a and a second end connected to the input terminal 101a of the amplifier 101 through the transmission line 41b. The band pass filter 78 has a first end connected to the transmission line 42a and a second end connected to the input terminal 102a of the amplifier 102 through the transmission line 42b. The band pass filter 77 has a first end connected to the transmission line 46a and a second end connected to the node 601 provided in the transmission line 46b through the transmission line 46b.

It should be noted that the switch 302 is in any one of the state in which the first end and the second end thereof are electrically connected to each other, the state in which the first end and the third end thereof are electrically connected to each other, and the state in which the first end and the fourth end thereof are electrically connected to each other in the power amplification circuit 15 according to this embodiment, but the switch 302 may be in the state in which the first end thereof is electrically connected to none of the second end, the third end, and the fourth end thereof. In this state, the transmission line 44 is electrically insulated from all of the transmission line 41a, the transmission line 42a, and the transmission line 46a.

In addition, the power amplification circuit 15 according to this embodiment includes the band pass filters 77, 78, and 79, but the power amplification circuit 15 may include any one or any two of the band pass filters 77, 78, and 79. In addition, the power amplification circuit 15 does not need to include the band pass filters 77, 78, and 79.

Sixth Embodiment

Figure 12:
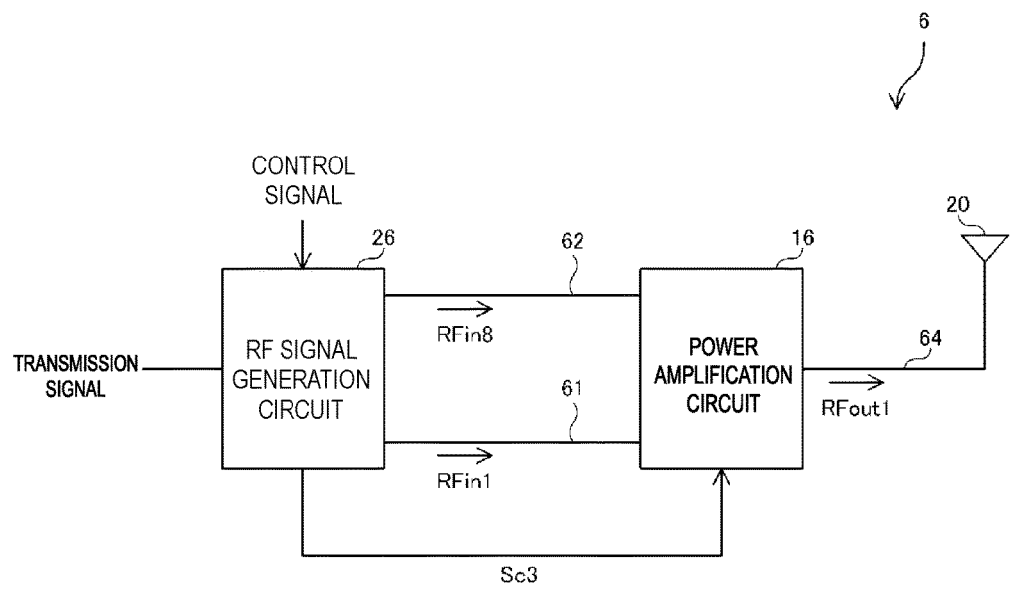
FIG. 12 is a diagram illustrating the structure of a transmission device according to a sixth embodiment of the present disclosure.

A transmission device according to a sixth embodiment will be described. FIG. 12 is a diagram illustrating the structure of the transmission device according to the sixth embodiment of the present disclosure. A transmission device 6 according to the sixth embodiment is different from the transmission device 1 according to the first embodiment in that the transmission device 6 includes a power amplification circuit 16 and an RF signal generation circuit 26 instead of the power amplification circuit 11 and the RF signal generation circuit 21, as illustrated in FIG. 12.

The RF signal generation circuit 26 modulates the transmission signal based on, for example, a control signal received from the control unit of a mobile communication device and generates at least one of the input signals RFin1 (n79 signal) and RFin8 for wireless transmission. Here, the input signal RFin8 is any one of the input signal RFin3 (n78 signal) and the input signal RFin4 (n77 signal).

That is, the RF signal generation circuit 26 may generate the input signals RFin1 and RFin8 at the same time or may generate the input signals RFin1 and RFin8 separately from each other. In addition, regarding the input signal RFin8, the RF signal generation circuit 26 generates the input signals RFin3 and RFin4 separately from each other. That is, the RF signal generation circuit 26 does not generate the input signals RFin3 and RFin4 at the same time.

The RF signal generation circuit 26 performs the following processing when, for example, the mobile communication device communicates using the n79 signal. That is, the RF signal generation circuit 26 generates the input signal RFin1 based on the control signal, supplies the generated input signal RFin1 to the transmission line 61, and outputs a switch changeover signal Sc3 indicating the first level to the power amplification circuit 16. In contrast, when the mobile communication device does not communicate using the n79 signal, for example, the RF signal generation circuit 26 does not generate the input signal RFin1, but outputs the switch changeover signal Sc3 indicating the fifth level to the power amplification circuit 16.

In addition, the RF signal generation circuit 26 performs the following processing when, for example, the mobile communication device communicates using the n78 signal. That is, the RF signal generation circuit 26 generates the input signal RFin8 based on the control signal, supplies the generated input signal RFin8 to the transmission line 62, and outputs the switch changeover signal Sc3 indicating the third level to the power amplification circuit 16. In this case, the input signal RFin8 is the input signal RFin3 (n78 signal).

In addition, the RF signal generation circuit 26 performs the following processing when, for example, the mobile communication device communicates using the n77 signal. That is, the RF signal generation circuit 26 generates the input signal RFin8 based on the control signal, supplies the generated input signal RFin8 to the transmission line 62, and outputs the switch changeover signal Sc3 indicating the fourth level to the power amplification circuit 16. In this case, the input signal RFin8 is the input signal RFin4 (n77 signal).

Figure 13:
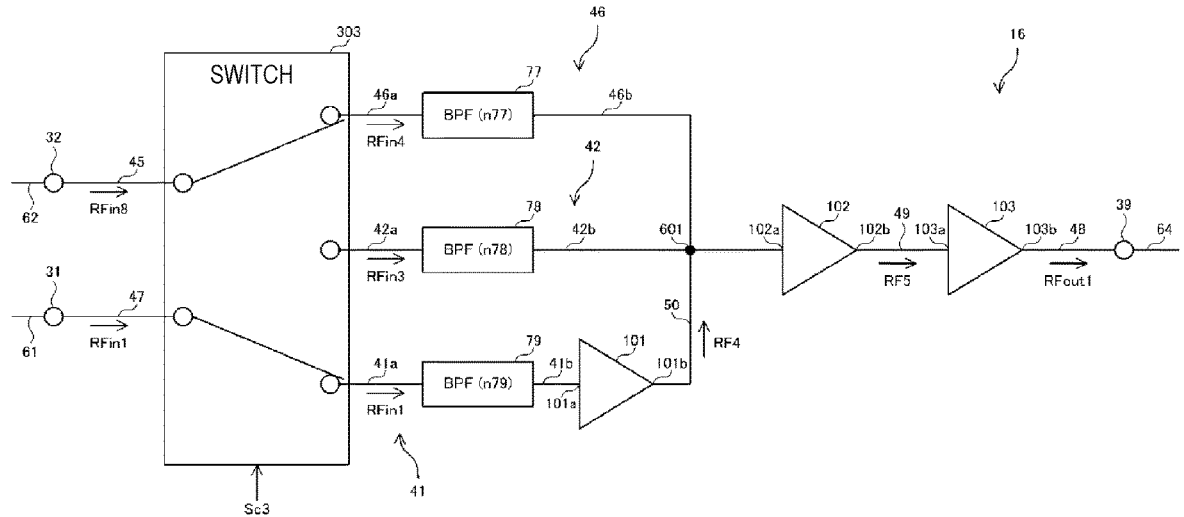
FIG. 13 is a circuit diagram of a power amplification circuit according to the sixth embodiment of the present disclosure.

The power amplification circuit according to the sixth embodiment will be described. FIG. 13 is a circuit diagram of the power amplification circuit according to the sixth embodiment of the present disclosure. As compared with the power amplification circuit 11 illustrated in FIG. 3, the power amplification circuit 16 according to the sixth embodiment further includes transmission lines 45 (fifth wiring), 46 (sixth wiring), and 47 (seventh wiring), a switch 303 (second switch unit), the band pass filters 77 (first filter), 78 (second filter), and 79 (third filter). The transmission line 41 includes the transmission lines 41a and 41b. The transmission line 42 includes the transmission lines 42a and 42b. The transmission line 46 includes the transmission lines 46a and 46b.

The RF signal input terminal 31 is connected to the transmission line 61 and the transmission line 47 and supplied with the input signal RFin1. The RF signal input terminal 32 is connected to the transmission line 62 and the transmission line 45 and supplied with the input signal RFin8.

The switch 303 is configured to make the transmission line 45 connectable to any one of the transmission line 42 and the transmission line 46 and configured to enable or disable continuity between the transmission line 47 and the transmission line 41 switchable. Specifically, the switch 303 is a double-pole three-throw (DP3T) switch and is achieved by, for example, a FET.

The switch 303 has a first end connected to the RF signal input terminal 31 through the transmission line 47, a second end connected to the transmission line 41a, a third end connected to the transmission line 42a, a fourth end connected to the transmission line 46a, and a fifth end connected to the RF signal input terminal 32 through the transmission line 45.

After receiving the switch changeover signal Sc3 indicating the first level from the RF signal generation circuit 26, the switch 303 electrically connects the first end and the second end thereof to each other. At this time, the input signal RFin1 (n79 signal) is supplied to the transmission line 41a through the transmission line 61, the RF signal input terminal 31, the transmission line 47, and the switch 303. In contrast, after receiving the switch changeover signal Sc3 indicating the fifth level from the RF signal generation circuit 26, the switch 303 electrically insulates the first end and the second end thereof from each other.

After receiving the switch changeover signal Sc3 indicating the third level from the RF signal generation circuit 26, the switch 303 electrically connects the fifth end and the third end thereof to each other. At this time, the input signal RFin8, that is, the input signal RFin3 (n78 signal) is supplied to the transmission line 42a through the transmission line 62, the RF signal input terminal 32, the transmission line 45, and the switch 303.

After receiving the switch changeover signal Sc3 indicating the fourth level from the RF signal generation circuit 26, the switch 303 electrically connects the fifth end and the fourth end thereof to each other. At this time, the input signal RFin8, that is, the input signal RFin4 (n77 signal) is supplied to the transmission line 46a through the transmission line 62, the RF signal input terminal 32, the transmission line 45, and the switch 303.

The band pass filter 79 has a first end connected to the transmission line 41a and a second end connected to the input terminal 101a of the amplifier 101 through the transmission line 41b. The band pass filter 78 has a first end connected to the transmission line 42a and a second end connected to the input terminal 102a of the amplifier 102 through the transmission line 42b. The band pass filter 77 is provided in the transmission line 46 that connects the fourth end of the switch 303 and the node 601 provided in the transmission line 42b to each other. Specifically, the band pass filter 77 has a first end connected to the transmission line 46a and a second end connected to the node 601 through the transmission line 46b.

It should be noted that the switch 303 is in any one of the state in which the fifth end and the third end thereof are electrically connected to each other and the state in which the fifth end and the fourth end thereof are electrically connected to each other in the power amplification circuit 16 according to this embodiment, but the switch 303 may be in the state in which the fifth end thereof is electrically connected to none of the third end and the fourth end thereof. In this state, the transmission line 45 is electrically insulated from both of the transmission line 42a and the transmission line 46a.

In addition, the power amplification circuit 16 according to this embodiment includes the band pass filters 77, 78, and 79, but the power amplification circuit 16 may include any one or any two of the band pass filters 77, 78, and 79. In addition, the power amplification circuit 16 does not need to include the band pass filters 77, 78, and 79.

Seventh Embodiment

Figure 14:
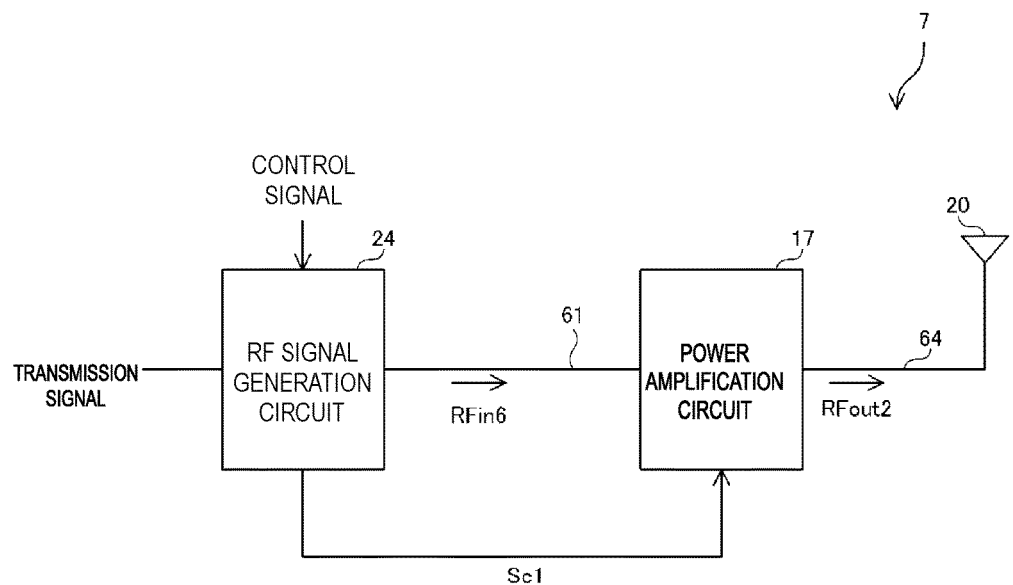
FIG. 14 is a diagram illustrating the structure of a transmission device according to a seventh embodiment of the present disclosure.

A transmission device according to a seventh embodiment will be described. FIG. 14 is a diagram illustrating the structure of the transmission device according to the seventh embodiment of the present disclosure. A transmission device 7 according to the seventh embodiment is different from the transmission device (see FIG. 9) according to the fourth embodiment in that the transmission device 7 includes a power amplification circuit 17 instead of the power amplification circuit 14, as illustrated in FIG. 14.

Figure 15:
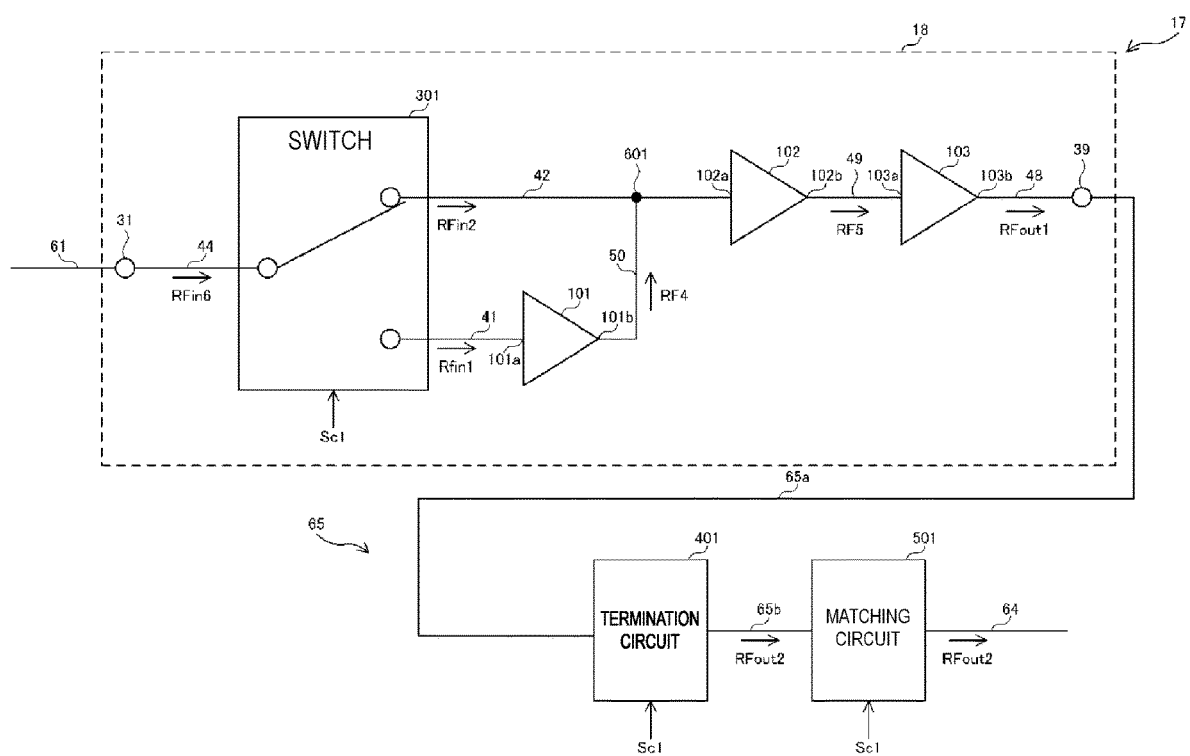
FIG. 15 is a diagram illustrating the structure of a power amplification circuit according to the seventh embodiment of the present disclosure.

FIG. 15 is a diagram illustrating the structure of the power amplification circuit according to the seventh embodiment of the present disclosure. As illustrated in FIG. 15, the power amplification circuit 17 includes an amplification circuit group 18, a termination circuit 401, a matching circuit 501, and a transmission line 65 (eighth wiring). The transmission line 65 includes transmission lines 65a and 65b.

The amplification circuit group 18 has the same circuit structure as the power amplification circuit 14 (see FIG. 10). The termination circuit 401 and the matching circuit 501 are provided in the transmission line 65 that connects the amplification circuit group 18 and the transmission line 64 (subsequent circuit) to each other. Specifically, the transmission line 65a connects the RF signal output terminal 39 of the amplifier circuit group 18 and the termination circuit 401 to each other. The transmission line 65b connects the termination circuit 401 and the matching circuit 501 to each other. The transmission line 64 connects the matching circuit 501 and the antenna 20 (subsequent circuit) to each other.

Figure 16:
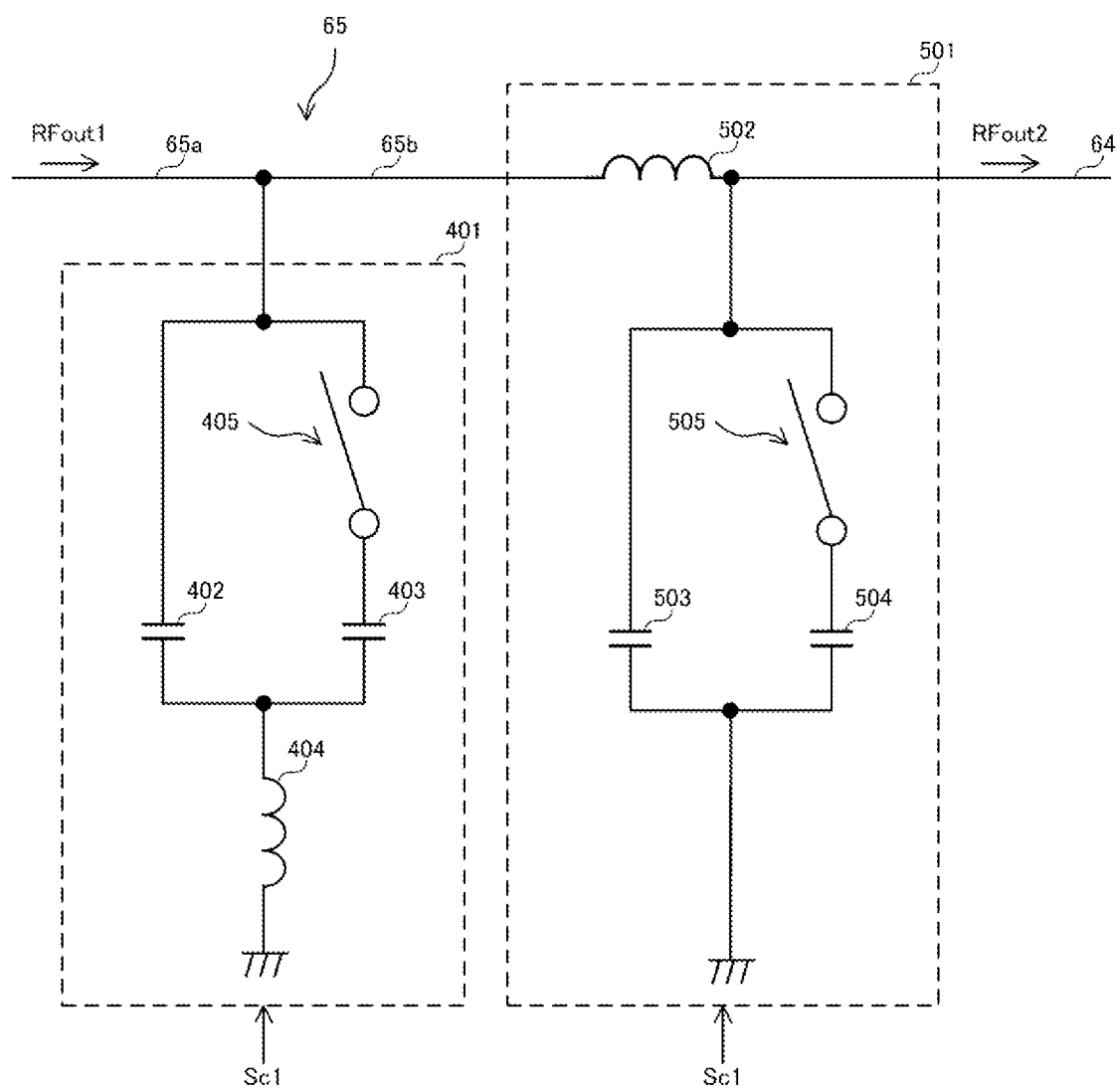
FIG. 16 is a circuit diagram of a termination circuit and a matching circuit according to the seventh embodiment of the present disclosure.

The termination circuit according to the seventh embodiment will be described. FIG. 16 is a circuit diagram of the termination circuit and the matching circuit according to the seventh embodiment of the present disclosure. The termination circuit 401 according to the seventh embodiment includes capacitors 402 and 403, an inductor 404, and a switch 405 (fourth switch unit).

The switch 405 of the termination circuit 401 has a first end connected to the RF signal output terminal 39 of the amplification circuit group 18 through the transmission line 65a and a second end. The capacitor 403 has a first end connected to the second end of the switch 405 and a second end. The capacitor 402 has a first end connected to the first end of the switch 405 and a second end. The inductor 404 has a first end connected to the second end of the capacitor 402 and the second end of the capacitor 403 and a second end grounded.

The switch 405 switches between a high frequency attenuation state in which the harmonic wave of the output signal RFout1 that is based on the input signal RFin1 is attenuated and a low frequency attenuation state in which the harmonic wave of the output signal RFout1 that is based on the input signal RFin2 is attenuated. Specifically, the switch 405 is a single-pole single-throw (SPST) switch and is achieved by, for example, an FET.

After receiving the switch changeover signal Sc1 indicating the first level from the RF signal generation circuit 24, the switch 405 electrically insulates the first end and the second end thereof from each other and shifts the termination circuit 401 to the high frequency attenuation state. At this time, an LC series circuit is formed by the capacitor 402 and the inductor 404 in the termination circuit 401. This LC series circuit has a resonant frequency corresponding to, for example, the frequency of the harmonic wave of the output signal RFout1 obtained by amplifying the input signal RFin1. Since this can bypass the harmonic wave to the ground, the output signal RFout2 in which the harmonic wave has been suppressed can be generated and output to the antenna 20.

After receiving the switch changeover signal Sc1 indicating the second level from the RF signal generation circuit 24, the switch 405 electrically connects the first end and the second end thereof to each other and shifts the termination circuit 401 to the low frequency attenuation state. At this time, an LC series circuit is formed by the capacitors 402 and 403 and the inductor 404 in the termination circuit 401. This LC series circuit has a resonant frequency lower than, for example, the resonant frequency in the high frequency attenuation state. Since this can bypass the harmonic wave of the output signal RFout1 obtained by amplifying the input signal RFin2 to the ground, the output signal RFout2 in which the harmonic wave has been suppressed can be generated and output to the antenna 20.

It should be noted that two inductors may be provided instead of the capacitors 402 and 403, respectively, and a capacitor may be provided instead of the inductor 404 in the termination circuit 401.

The matching circuit according to the seventh embodiment will be described. The matching circuit 501 according to the seventh embodiment includes an inductor 502, capacitors 503 and 504, and a switch 505 (third switch unit).

The transmission line 64 is, for example, a coaxial cable or a microstrip line and has a characteristic impedance. The antenna 20 has, for example, an input impedance. In this embodiment, the transmission line 64 and the antenna 20 are specific examples of subsequent circuits that are subject to impedance matching by the matching circuit 501 for the fundamental wave of the output signal.

The inductor 502 of the matching circuit 501 has a first end connected to the transmission line 65a and the first end of the switch 405 through the transmission line 65b and a second end. The switch 505 has a first end connected to the second end of the inductor 502 and a second end. The capacitor 504 has a first end connected to the second end of the switch 505 and a second end grounded. The capacitor 503 has a first end connected to the first end of the switch 505 and a second end connected to the second end of the capacitor 504.

The switch 505 switches between a high-frequency matching state in which the impedance of the amplifier 103 of the power amplification circuit 17 is matched to the impedance of the transmission line 64 and the antenna 20 for the output signal RFout1 that is based on the input signal RFin1 and a low frequency matching state in which these impedances are matched to each other for the output signal RFout1 that is based on the input signal RFin2. Specifically, the switch 505 is a single-pole single-throw (SPST) switch and is achieved by, for example, a FET.

After receiving the switch changeover signal Sc1 indicating the first level from the RF signal generation circuit 24, the switch 505 electrically insulates the first end and the second end thereof from each other and shifts the matching circuit 501 to the high frequency matching state. At this time, a low pass filter is formed by the inductor 502 and the capacitor 503 in the matching circuit 501. This low pass filter has a cutoff frequency corresponding to, for example, the frequency of the output signal RFout1 obtained by amplifying the input signal RFin1 and matches the impedance of the amplifier 103 to the impedance of the transmission line 64 and the antenna 20 for the output signal RFout1 that is based on the input signal RFin1.

After receiving the switch changeover signal Sc1 indicating the second level from the RF signal generation circuit 24, the switch 505 electrically connects the first end and the second end thereof to each other and shifts the matching circuit 501 to the low frequency matching state. At this time, a low pass filter is formed by the inductor 502 and the capacitors 503 and 504 in the matching circuit 501. This low pass filter has a cutoff frequency lower than, for example, the cutoff frequency in the high frequency matching state and matches the impedance of the amplifier 103 to the impedance of the transmission line 64 and the antenna 20 for the output signal RFout1 that is based on the input signal RFin2.

It should be noted that two inductors may be provided instead of the capacitors 503 and 504, respectively, and a capacitor may be provided instead of the inductor 502 in the matching circuit 501.

In addition, the transmission device 7 according to this embodiment includes the termination circuit 401 and the matching circuit 501, but the transmission device 7 may include any one of the termination circuit 401 and the matching circuit 501.

In addition, each of the power amplification circuits according to the embodiments of the present disclosure includes the amplifier 102 and the amplifier 103 connected in series as the second amplifier circuit, but the power amplification circuit may include any one of the amplifier 102 and the amplifier 103 as the second amplifier circuit or may include three or more amplifiers connected in series. It should be noted that each of the power amplification circuits has the second amplification circuit including two or more amplifiers connected in series, so the power amplification circuit can obtain a sufficient gain.

In addition, the second frequency band of the second signal is included in the third frequency band of the third signal in the power amplification circuits according to the embodiments of the present disclosure, but the second frequency band and the third frequency band may partially overlap with each other or the second frequency band and the third frequency band do not have to overlap with each other.

Problems

Figure 17:
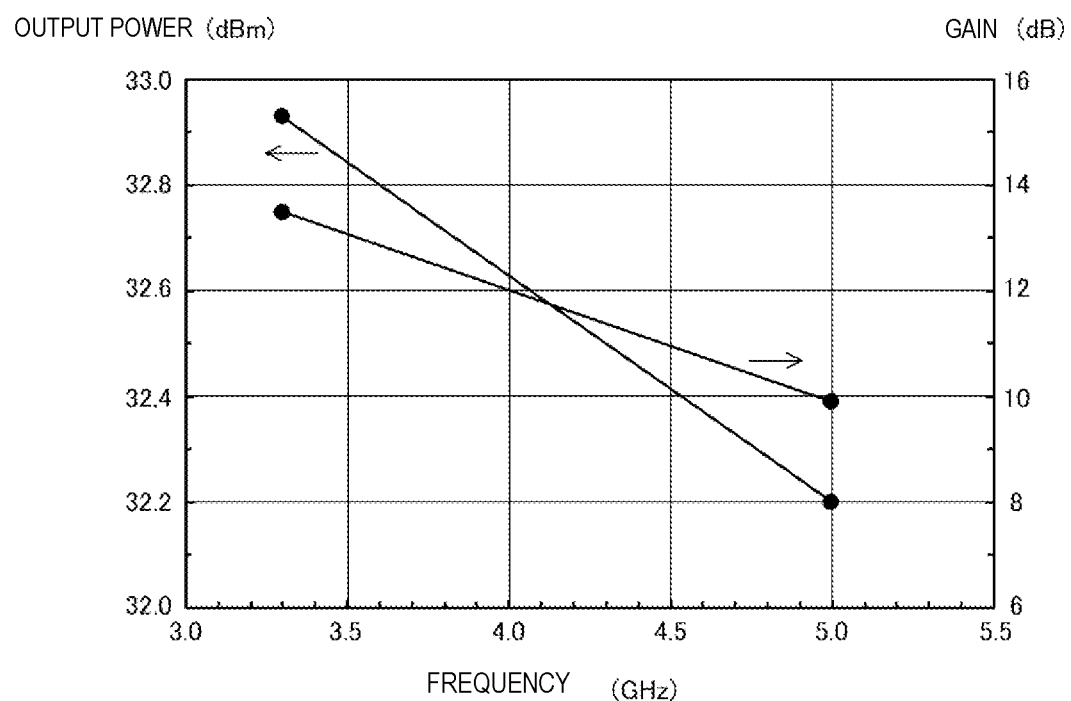
FIG. 17 is a diagram illustrating examples of changes in the output power and changes in the gain with respect to the frequency of an input signal in the power amplification circuit according to a reference example.

FIG. 17 is a diagram illustrating examples of changes in the output power and changes in the gain with respect to the frequency of an input signal in the power amplification circuit according to a reference example. It should be noted that the horizontal axis of FIG. 17 represents the frequency in "GHz", the vertical axis on the left side represents the output power in "dBm", and the vertical axis on the right side represents the gain in "dB".

As illustrated in FIG. 17, the power amplification circuit according to the reference example includes an amplifier at the power stage. The gain obtained when an approximately 5 GHz input signal is supplied to the amplifier at the power stage is approximately 3.6 dB lower than the gain obtained when an approximately 3.3 GHz input signal is supplied to the amplifier.

In addition, the output power of the amplifier obtained when the approximately 5 GHz input signal is supplied to the amplifier at the power stage is approximately 0.7 dBm lower than the output power of the amplifier obtained when the approximately 3.3 GHz input signal is supplied to the amplifier.

That is, when amplifying the n77 signal, the n78 signal, and the n79 signal, the power amplification circuit according to the reference example cannot sufficiently amplify the n79 signal disadvantageously because the gain is small on the high frequency side. The power amplification circuit needs to suppress reduction in the gain at high frequencies.

Exemplary embodiments of the present disclosure have been described above. The power amplification circuit 11 includes the transmission line 41 to which the input signal RFin1 is supplied, the transmission line 42 to which the input signal RFin2 is supplied, the amplifier 101 that amplifies the first signal supplied through the transmission line 41 and supplies the amplified signal RF4 to the transmission line 42, and the amplifiers 102 and 103 that amplify the signal supplied through the transmission line 42 and outputs the output signal RFout1. Here, the frequency of the input signal RFin1 is higher than the frequency of the input signal RFin2.

By amplifying the low frequency input signal RFin2 through the amplifiers 102 and 103 and amplifying the high frequency input signal RFin1 through the amplifiers 101, 102, and 103 as described above, the lack of the gains when the amplifiers 102 and 103 amplify the input signal RFin1 can be compensated by amplifying the input signal RFin1 through the amplifier 101. Since this can suppress reduction in the gain of the input signal RFin1 on the high frequency side, the power amplification circuit 11 that obtains the gain, that is, the amplification rate in a wide frequency band can be achieved. In addition, by not providing a large switch that can withstand the power of the amplified signal between the amplifier 101 and the amplifier 102 or 103, the size of the power amplification circuit 11 can be reduced. Accordingly, in the structure in which two signals with different frequencies are input, reduction in the amplification rate due to frequencies can be suppressed.

In addition, the power amplification circuit 13 further includes the transmission line 43 to which the input signal RFin5 including at least one of the input signals RFin1 and RFin2 is supplied, and the signal isolation unit 201 that supplies the input signal RFin1 of the input signal RFin5 supplied through the transmission line 43 to the transmission line 41 and supplies the input signal RFin2 of the input signal RFin5 to the transmission line 42.

By not providing a switch that switches the transmission path of the input signal RFin5 as described above, the need for the control signal for switching is eliminated, so the circuit structure around the power amplification circuit 13 can be simplified. In addition, even when the input signals RFin1 and RFin2 are supplied to the transmission line 43 at the same time, by separating the input signal RFin5 into the input signals RFin1 and RFin2, communication using technologies, such as CA and DC can be performed in, for example, a mobile communication device and the gains of the input signals RFin1 and RFin2 can be obtained.

In addition, the power amplification circuit 14 further includes the transmission line 44 to which the input signal RFin6 including any one of the input signals RFin1 and RFin2 is supplied, and the switch 301 configured to make the transmission line 44 connectable to any one of the transmission lines 41 or 42.

By providing the switch 301 at a preceding stage of the amplifiers 101 and 102 to switch the transmission path for the input signal RFin6 having low power before being amplified as described above, the switching of the transmission destination of the input signal RFin6 is enabled and the size of the switch 301 can be reduced. Since this can reduce the parasitic capacitance that is based on the size of the switch 301, reduction in the amplification rates of the amplifiers of the power amplification circuit 14 can be suppressed and the loss in the power amplification circuit 14 can be reduced.

In addition, the power amplification circuit 15 further includes the transmission line 44 to which the input signal RFin7 including any one of the input signals RFin1, RFin3, and RFin4 is supplied, and the switch 302 configured to make the transmission line 44 connectable to any one of the transmission lines 41, 42, and 46.

By providing the switch 302 at a preceding stage of the amplifiers 101 and 102 to switch the transmission path for the input signal RFin7 having low power before being amplified as described above, the switching of the transmission destination of the input signal RFin7 is enabled and the size of the switch 302 can be reduced. Since this can reduce the parasitic capacitance that is based on the size of the switch 302, reduction in the amplification rates of the amplifiers of the power amplification circuit 15 can be suppressed and the loss in the power amplification circuit 15 can be reduced.

In addition, the power amplification circuit 16 further includes the transmission line 45 to which the input signal RFin8 including any one of the input signals RFin3 and RFin4 is supplied, the transmission line 46 connected to the transmission line 42b, the transmission line 47 to which the input signal RFin1 is supplied, the switch 303 configured to make the transmission line 45 connectable to any one of the transmission line 42 and the transmission line 46 and configured to enable or disable continuity between the transmission line 47 and the transmission line 41 switchable, the band pass filter 77 which is provided in the transmission line 46 and attenuates the frequency component deviating from the n77 band, and the band pass filter 78 which is provided in the transmission line 42 and attenuates the frequency component deviating from the n78 band.

By providing the switch 303 at a preceding stage of the amplifiers 101 and 102 to switch the transmission path for the input signal RFin8 having low power before being amplified and enable or disable the continuity of the input signal RFin1 switchable as described above, it is possible to perform switching of the transmission destination of the input signal RFin8 and the switching between supply and non-supply of the input signal RFin1 and reduce the size of the switch 303. Since this can reduce the parasitic capacitance that is based on the size of the switch 303, reduction in the amplification rates of the amplifiers of the power amplification circuit 16 can be suppressed and the loss in the power amplification circuit 16 can be reduced. In addition, by providing the band pass filter 77 in the transmission line 46, unnecessary signals, such as noise can be removed from the n77 signal. In addition, by providing the band pass filter 78 in the transmission line 42, unnecessary signals, such as noise can be removed from the n78 signal.

In addition, each of the power amplification circuits 12, 15, and 16 further includes the band pass filter 79 which is provided in the transmission line 41 and attenuates the frequency components that deviate from the n79 band.

By providing the band pass filter 79 in the transmission line 41 as described above, unnecessary signals, such as noise can be removed from the n79 signal.

In addition, each of the power amplification circuits 12 and 15 further includes the band pass filter 78 which is provided in the transmission line 42 and attenuates the frequency components that deviate from the n78 band.

By providing the band pass filter 78 in the transmission line 42 as described above, unnecessary signals, such as noise can be removed from the n78 signal.

In addition, the power amplification circuit 17 further includes the matching circuit 501 provided in the transmission line 65 that connects the amplifier 103 to the transmission line 64 and the antenna 20. The matching circuit 501 includes the switch 505 that switches between the high frequency matching state in which the impedance of the amplifier 103 is matched to the impedance of the transmission line 64 and the antenna 20 for the output signal RFout1 that is based on the input signal RFin1 and the low frequency matching state in which these impedances are matched to each other for the output signal RFout1 that is based on the input signal RFin2.

Since the impedance of the amplifier 103 is matched to the impedance of the transmission line 64 and the antenna 20 in a wide frequency band in the structure described above, the output signal RFout1 can be efficiently transmitted to the transmission line 64 and the antenna 20. That is, the matching circuit 501 suitable for the frequency band width of the amplification rate of the power amplification circuit 17 can be provided.

In addition, the power amplification circuit 17 further includes the termination circuit 401 provided in the transmission line 65 that connects the amplifier 103 to the transmission line 64 and the antenna 20. The termination circuit 401 includes the switch 405 that switches between the high frequency attenuation state in which the harmonic wave of the output signal RFout1 that is based on the input signal RFin1 is attenuated and the low frequency attenuation state in which the harmonic wave of the output signal RFout1 that is based on the input signal RFin2 is attenuated.

Since the harmonic wave can be attenuated in a wide frequency band in the structure described above, the output signal RFout1 of good quality can be transmitted to the transmission line 64 and the antenna 20. That is, the termination circuit 401 suitable for the frequency band width of the amplification rate of the power amplification circuit 17 can be provided.

In addition, the frequency of the first signal is higher than the frequency of the second signal in the power amplification circuits according to the embodiments of the present disclosure, but the frequency of the first signal may be smaller than the frequency of the second signal.

It should be noted that the embodiments described above are provided to facilitate the understanding of the present disclosure and are not intended for limiting the interpretation of the present disclosure. The present disclosure can be changed or improved without necessarily departing from the spirit, and the present disclosure includes equivalents thereof. That is, modifications obtained by making design changes to the embodiments as appropriate by a person skilled in the art are also included in the scope of the present disclosure as long as the modifications have the characteristics of the present disclosure. For example, the elements included in the embodiments, and the arrangement, the material, the condition, the shape, the size, and the like of the elements are not limited to those illustrated and can be changed as appropriate. In addition, it will be appreciated that the embodiments are examples and the structures illustrated by different embodiments can be partially replaced or combined, and these modifications are also included in the scope of the present disclosure as long as the characteristics of the present disclosure are included.

While embodiments of the disclosure have been described above, it is to be understood that variations and modifications will be apparent to those skilled in the art without necessarily departing from the scope and spirit of the disclosure. The scope of the disclosure, therefore, is to be determined solely by the following claims.

What is claimed is:
1. A power amplification circuit comprising:
a first wiring configured to receive a first signal having a first frequency;
a second wiring configured to receive a second signal having a second frequency, the first frequency band being higher than the second frequency;
a first amplification circuit configured to amplify the first signal having the first frequency with a pre-gain and to output a first amplified signal with the pre-gain to the second wiring, the first amplified signal being supplied to the first amplification circuit through the first wiring;
a second amplification circuit configured to receive the first amplified signal and the second signal supplied through the second wiring, and configured to amplify the first amplified signal and the second signal with a main gain to output a second amplified signal; and
a third filter configured to attenuate a frequency component outside of a first frequency band that includes the first frequency, the third filter being in-line with the first wiring.

2. The power amplification circuit according to claim 1, further comprising:
a third wiring configured to receive an input signal, the input signal including the first signal, the second signal, or a combination of the first signal and the second signal; and
a signal isolation circuit configured to receive the input signal from the third wiring, and to supply the first signal to the first wiring and to supply the second signal to the second wiring.

3. The power amplification circuit according to claim 1, further comprising:
a fourth wiring configured to receive an input signal, the input signal including the first signal, the second signal, or a combination of the first signal and the second signal; and
a first switch circuit configured to selectively connect the fourth wiring to the first wiring or to the second wiring.

4. The power amplification circuit according to claim 1, further comprising:
a fifth wiring configured to receive an input signal, the input signal including a third signal having a third frequency, the third frequency being different than the first frequency and the second frequency;
a sixth wiring connected to the second wiring;
a seventh wiring configured to receive the first signal;
a second switch circuit configured to selectively connect the fifth wiring to the second wiring or to the sixth wiring, and to selectively connect the seventh wiring to the first wiring;
a first filter configured to attenuate a frequency component outside of a third frequency band that includes the third frequency, the first filter being in-line with the sixth wiring; and
a second filter configured to attenuate a frequency component outside a second frequency band that includes the second frequency, the second filter being in-line with the second wiring.

5. The power amplification circuit according to claim 1, further comprising:
a second filter configured to attenuate a frequency component outside of a second frequency band that includes the second frequency, the second filter being in-line with the second wiring.

6. The power amplification circuit according to claim 1, further comprising:
a matching circuit in-line with an eighth wiring, the matching circuit connecting the second amplification circuit and a subsequent circuit to each other,
wherein the matching circuit comprises a third switch circuit that is configured to selectively switch between a state in which an impedance of the second amplification circuit is matched to an impedance of the subsequent circuit for the second amplified signal that is based on the first signal, and a state in which the impedances are matched to each other for the second amplified signal that is based on the second signal.

7. The power amplification circuit according to claim 1, further comprising:

a termination circuit in-line with an eighth wiring, the termination circuit connecting the second amplification circuit and a subsequent circuit to each other,
wherein the termination circuit comprises a fourth switch circuit that is configured to selectively switch between a state in which a harmonic wave of the second amplified signal that is based on the first signal is attenuated and a state in which a harmonic wave of the second amplified signal that is based on the second signal is attenuated.

8. A power amplification circuit comprising:
a first wiring configured to receive a first signal having a first frequency;
a second wiring configured to receive a second signal having a second frequency, the first frequency being higher than the second frequency;
a first amplification circuit configured to amplify the first signal having the first frequency and to output a first amplified signal to the second wiring, the first signal being supplied to the first amplification circuit through the first wiring; and
a second amplification circuit configured to amplify a signal supplied through the second wiring and configured to output a second amplified signal,
wherein the second amplification circuit comprises a plurality of amplifiers connected in series.

9. The power amplification circuit according to claim 2, further comprising:
a second filter configured to attenuate a frequency component outside of a second frequency band that includes the second frequency, the second filter being in-line with the second wiring.

10. The power amplification circuit according to claim 3, further comprising:
a second filter configured to attenuate a frequency component outside of a second frequency band that includes the second frequency, the second filter being in-line with the second wiring.

11. The power amplification circuit according to claim 2, further comprising:
a matching circuit in-line with an eighth wiring, the matching circuit connecting the second amplification circuit and a subsequent circuit to each other,
wherein the matching circuit comprises a third switch circuit that is configured to selectively switch between a state in which an impedance of the second amplification circuit is matched to an impedance of the subsequent circuit for the second amplified signal that is based on the first signal, and a state in which the impedances are matched to each other for the second amplified signal that is based on the second signal.

12. The power amplification circuit according to claim 3, further comprising:
a matching circuit in-line with an eighth wiring, the matching circuit connecting the second amplification circuit and a subsequent circuit to each other,
wherein the matching circuit comprises a third switch circuit that is configured to selectively switch between a state in which an impedance of the second amplification circuit is matched to an impedance of the subsequent circuit for the second amplified signal that is based on the first signal, and a state in which the impedances are matched to each other for the second amplified signal that is based on the second signal.

13. The power amplification circuit according to claim 4, further comprising:

a matching circuit in-line with an eighth wiring, the matching circuit connecting the second amplification circuit and a subsequent circuit to each other, wherein the matching circuit comprises a third switch circuit that is configured to selectively switch between a state in which an impedance of the second amplification circuit is matched to an impedance of the subsequent circuit for the second amplified signal that is based on the first signal, and a state in which the impedances are matched to each other for the second amplified signal that is based on the second signal.

14. The power amplification circuit according to claim 1, further comprising:

a matching circuit in-line with an eighth wiring, the matching circuit connecting the second amplification circuit and a subsequent circuit to each other, wherein the matching circuit comprises a third switch circuit that is configured to selectively switch between a state in which an impedance of the second amplification circuit is matched to an impedance of the subsequent circuit for the second amplified signal that is based on the first signal, and a state in which the impedances are matched to each other for the second amplified signal that is based on the second signal.

* * * * *

UNITED STATES PATENT AND TRADEMARK OFFICE
CERTIFICATE OF CORRECTION

| | | |
|---|---|---|
| PATENT NO. | : 12,308,809 B2 | Page 1 of 1 |
| APPLICATION NO. | : 17/460543 | |
| DATED | : May 20, 2025 | |
| INVENTOR(S) | : Shigeki Koya et al. | |

It is certified that error appears in the above-identified patent and that said Letters Patent is hereby corrected as shown below:

In the Specification

Column 14, Line 60, "transmission device (see" should be --transmission device 4 (see--

Signed and Sealed this
Fifteenth Day of July, 2025

Coke Morgan Stewart
*Acting Director of the United States Patent and Trademark Office*